background level. Therefore, the logic proceeds to step 907 and "D" which is present at the output of shift register 104 is selected as the output of multiplexer 33. This is byte number 4. From step 907 the logic proceeds through state 845 to state 847.

After the data timing pulse is received the logic moves from state 847 to state 851 wherein the data in shift register 104 is tested to determine if it is above the background. Because the data is not '0000' logic proceeds to step 863 wherein the data contained within shift register 104, "F", '1111', is selected as the output of multiplexer 33 and a load signal is sent. This is byte number 5 of table II. Because the row count is not equal to 47, the logic proceeds through state 865 to state 872. Byte number 5 represents the first of a train of redundant signals and four such signals already having been detected the logic will continue through state 872 and state 875 to step 912. In step 912 byte number 6, '0000', is generated by multiplexer 33 and the proper load signal is sent. The logic then continues through state 814 to state 816 and upon the receipt of a data timing pulse to state 921. Because the row count is not equal to 47, the logic continues through state 921 to state 927 because of the train of pulses is still being received the logic cycles through step 929, state 914, state 916, state 921 and state 927 until the last "F" i.e. the comparator 127 detects the last "F" and the '5' are not redundant. In the example the difference allowable between adjacent digital signals within the data stream to determine redundancy is '0000'. Thus, in the example the signals in order to be redundant must be equal.

After the last redundant signal is detected and such detection is prior to the row count equaling 46, the logic proceeds from state 927 through step 934, state 936, and step 938. Thus, the remainder of control marker that is a 1 followed by a 0 and the two most significant bits of the redundancy count are selected as the output of multiplexer 33. This is byte number 7 in table II. In step 938, byte number 8 which is the four least significant bits of the redundancy count is selected as the output of multiplexer 33. The redundancy count is equal to 21. The logic proceeds from step 938 through state 940 to state 942 wherein '5' is compared to the background level to determine if it is above the background level and, because it is, the logic proceeds to step 946 where '5' is selected as the output of multiplexer 33. This '5' is loaded into byte storage register 59 and is byte number 9, '0101', of table II.

The logic then proceeds from step 946 through state 950 (because the row count is not equal to 46) to state 954 wherein the test on digital signal which is equal to the '5' stored within shift register 104 is compared to the background. Since '5' is above the background, the logic proceeds through state 845 to state 847 and awaits a data timing pulse which indicates that a new digital signal is present in shift register 104.

After the data timing pulse is received logic proceeds to state 851 wherein the data is tested against the background. Because this data is a digital signal '0' the logic proceeds to step 855 through state 857 (because the row count is not equal to 47). At state 855 the multiplexer 33 generates a '0000' output which is byte number 10 of table II. The logic then proceeds through state 822 and awaits a data timing pulse and because the scan start pulse is not received at this time the logic proceeds through state 827 to state 834. Since the next bit of data is also a digital signal "0" the 0000 logic proceeds to state 820 and continues to recycle through this loop until the presence of the next signal which is not a '0' digital signal is detected. When, '7' is present in shift register 104 the logic then proceeds through step 839 wherein byte number 11 of table II is loaded, and through state 840 to step 841 wherein byte number 12 is selected as the output of multiplexer 33. The address represented by byte numbers 11 and 12 is 31 which is the location of the '7' within the scan. Because the most significant bit of byte number 11 is '0' during later reconstruction these two bytes after the first part of the control marker i.e., byte number 10 which is '0000', is understood as an address. Byte numbers 7 and 8 are understood to be a redundancy count because the most significant bit of byte number 7 after the first part of the control marker i.e. byte number 6 which '000' of table II is a logic "1". The logic proceeds from step 841 through state 842 on to step 844 wherein the byte number 13 i.e. the digital signal "', '0111', is selected as the output of multiplexer 33. The logic then proceeds through state 845 to state 847 wherein after a data timing pulse is detected the logic proceeds to state 851. Because the data is above background level, the logic goes from state 851 to step 863 wherein the output of shift register 104 is selected as the output of multiplexer 33. This is byte number 14 of table Ii and is an '8' represented digitally as '1000'. Logic then proceeds through state 865 because the row count is not equal to 47 to state 872. Because redundancy is not detected, the logic proceeds to state 847 through state 845. Byte number 15, '1010' which is a digital signal "A", is loaded in a similar manner. When the next '0000' digital signal is received the logic goes from state 851 through state 855 to step 857 wherein byte number 16, '0000', is generated by multiplexer 33. From state 855 the logic flows to state 822 through state 820, and as data timing pulses are received through state 827 and 834 and returning to state 820 because the digital signals are '0000'. Upon receipt of the next scan start pulse the logic flows from state 827 to step 829 and byte number 17, '0000', is generated within multiplexer 33. From step 829 the logic proceeds to step 895 through state 832 and in step 895 byte number 18, '0000', is generated within multiplexer 33.

If the logic is initially in state 880 when the scan start pulse for the raw data in table I is received, the logic would proceed from state 887 to step 892. Byte number 1, '0000', loaded prior to entry into state 880 in either step 877 or 972. In step 892 byte number 2, '0000', of table I is generated within multiplexer 33. The logic then proceeds to step 832 and from step 832 through the flow diagrams of FIGS. 10 and 11 as discussed above. It should also be pointed out that if the system has been reset and this is the first scan of data from the data lift, the entry point into the logic is through step 860 which is equivalent to flip-flop 404 of FIG. 6. After reset the logic enters state 860 and proceeds to load a first byte which is '0000' in step 877. Thereafter the logic continues as discussed above.

The row counter is reset to one when a scan start pulse is received and the row counter is incremented by one each occasion a data timing pulse is received. These steps have not been incorporated within the flow diagrams of FIG. 10 and 11. Also, the redundancy count would be equal to four prior to entry in the loop fo which step 929 is a part.

In summary, at the start of each scan the scan start pulse resets the address counters contained within controller 172 of the data compressor 20. The controller provides selection signals to 2 multiplexers, 33 and 176,

KEYBOARD SWITCH CIRCUIT FOR USE IN A MATRIX WHICH HAS A SERIES CIRCUIT INCLUDING A RELUCTANCE ELEMENT AND A DIODE CONNECTED BETWEEN EACH ROW AND COLUMN OF THE MATRIX

BACKGROUND OF THE INVENTION

The invention relates to a keyboard switch circuit, and in particular, to a keyboard switch circuit such as may be used in a desk-top electronic computers or terminal units of a usual computer.

A keyboard which is utilized in a desk-top electronic computer or in a terminal unit of a usual computer is desirably constructed without mechanical contacts by incorporating semiconductor elements so that the life may be improved even if the frequency of use may be increased. At this end, keyboard switch arrangements employing reluctance elements have heretofore been developed. By way of example, U.S. Pat. No. 3,764,818 issued to the present inventor on Oct. 9, 1973 discloses a switch circuit employing reluctance elements and which is characterized by the temperature compensation feature for the thermal characteristics of the reluctance elements. However, the use of such circuit in a keyboard switch arrangement requires the provision of the amplifier circuits for the individual reluctance elements, and the encoding must be effected by a diode matrix. As a result, the switch circuit becomes complex, increasing the number of parts required and also disadvantageously increasing the power dissipation.

OBJECTS OF THE INVENTION

It is an object of the invention to provide a keyboard switch circuit which is relatively simple in arrangement.

It is another object of the invention to provide a novel switch matrix circuit including a matrix circuit formed by m rows and n columns, each associated with a lead terminal, and wherein a series circuit comprising a reluctance element and a diode is connected between each row and each column, thereby simplifying the circuit arrangement and reducing the number of terminals.

It is a further object of the invention to provide a novel switch matrix circuit including a matrix circuit of m rows and n columns, each associated with a lead terminal, and wherein a series circuit comprising a reluctance element and a diode is connected between each row and each column with the diode being poled to conduct forwardly from the rows toward the columns or vice versa so that the respective reluctance elements do not present themselves as parallel impedance components to each other.

It is an additional object of the invention to provide a novel encoder ROM (Read Only Memory) drive circuit including a matrix circuit of m rows and n columns, each associated with a lead terminal, and wherein a series circuit comprising a reluctance element and a diode is connected between each row and each column and in which one of the signals from the rows and one of the signals from the columns are combined together to be inputted to the input circuit of an encoder ROM, thereby providing a particular key signal.

It is still another object of the invention to provide a novel keyboard switch circuit including a matrix circuit of m rows and n columns, each associated with a lead terminal, and wherein a series circuit comprising a reluctance element and a diode is connected between each row and each column and in which signals from the rows and columns as well as a strobe signal from either column or row are applied to a gate circuit to provide a keyboard output.

SUMMARY OF THE INVENTION

In accordance with the invention, a matrix circuit of m rows and n columns, each associated with a lead terminal, is provided with a number of contact-less key switches for providing a key output as a result of a change in the resistance of a reluctance element. At this end, a series circuit comprising a reluctance element and a diode is connected between each row and each column, and the diodes are poled to be forwardly biased either toward the columns or the rows. Additionally, there is provided first circuit means which applies pulses to the lead terminals of either rows or columns in a sequential manner, and second circuit means which produces a pulse output in response to pulses which appear at the lead terminals of the columns or rows which are not connected with the first circuit means. The pulse signal from the first and second circuit means are utilized to produce a keyboard output which corresponds to a particular key switch.

DETAILED DESCRIPTION OF EMBODIMENTS

Figure 1:
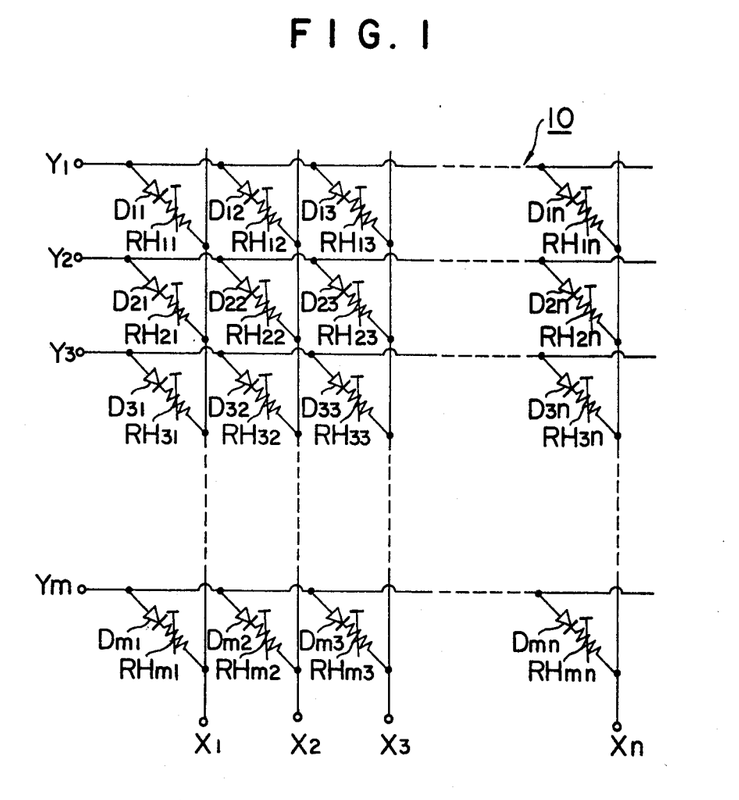
FIG. 1 is a circuit diagram of a switch matrix according to the invention.

Referring to FIG. 1, there is shown a switch matrix circuit 10 of m rows and n columns, comprising m row terminals $Y_1$-$Y_m$ and n column terminals $X_1$-$X_n$. A series circuit comprising a reluctance element $RH_{ij}$ ($i = 1 \sim m, j = 1 \sim n$) and a diode $D_{ij}$ ($i = 1 \sim m, j = 1 \sim n$) is connected between each row and each column. All of the diodes $D_{ij}$ are poled to conduct current from the lead terminals $Y_1, Y_2 \ldots Y_m$ toward the lead terminals $X_1, X_2 \ldots X_n$. As a consequence, when pulses are successively applied to the lead terminals $Y_1, Y_2 \ldots Y_m$, any particular reluctance element is not connected in parallel circuit relationship with other reluctance elements. In this manner, a signal appears at a lead terminal $X_j$ in response to a change in the resistance of a reluctance element $RH_{ij}$. The reluctance elements $RH_{ij}$ are equal in number to the number of key switches which are to be provided on a keyboard. When a key top is depressed, the flux density applied to a particular reluctance element $RH_{ij}$ varies, thereby causing a change in the resistance of the element $RH_{ij}$. A particular example of such element is shown in FIG. 2.

Figure 2:
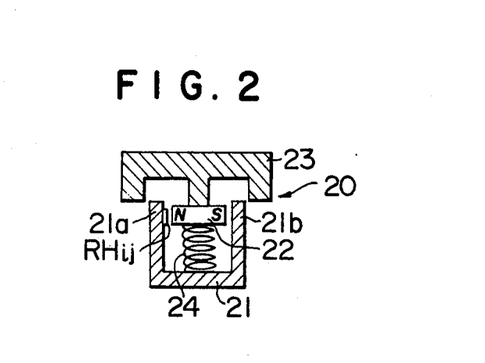
FIG. 2 is a schematic cross section of one example of a contact-less key switch which may be used in the circuit of FIG. 1.

Referring to FIG. 2, a typical key switch 20 is shown in schematic cross section, and comprises a stationary U-shaped yoke 21 formed of a magnetic material and having a pair of limbs 21a and 21b. In the example shown, a reluctance element $RH_{ij}$ is secured to a surface of the limb 21a which faces the other limb 21b. A magnet 22 which is secured to a key top 23 is disposed between the limbs 21a, 21b of the stationary yoke 21, with its poles N, S facing the respective limbs 21a, 21b. The magnet as well as the key top 23 are biased by a spring 24 so that one of the poles of the magnet 22 normally is located opposite to the reluctance element $RH_{ij}$, but is displaced therefrom when the key top 23 is depressed. When a finger is released from the key top 23, the magnet 22 returns to its initial position under the resilience of the spring 24, together with key top 23.

Thus, the reluctance element $RH_{ij}$ normally presents a high resistance, but its resistance is reduced when the key top 23 is depressed. Alternatively, the key switch 20 may be constructed such that the magnet 22 is normally out of alignment with the reluctance element $RH_{ij}$, but is moved into alignment therewith when the key top 23 is depressed so as to pass a higher flux through the element. This requires a corresponding adjustment of the circuit which is connected with the lead terminals $X_1 \ldots X_n$.

Figure 3:
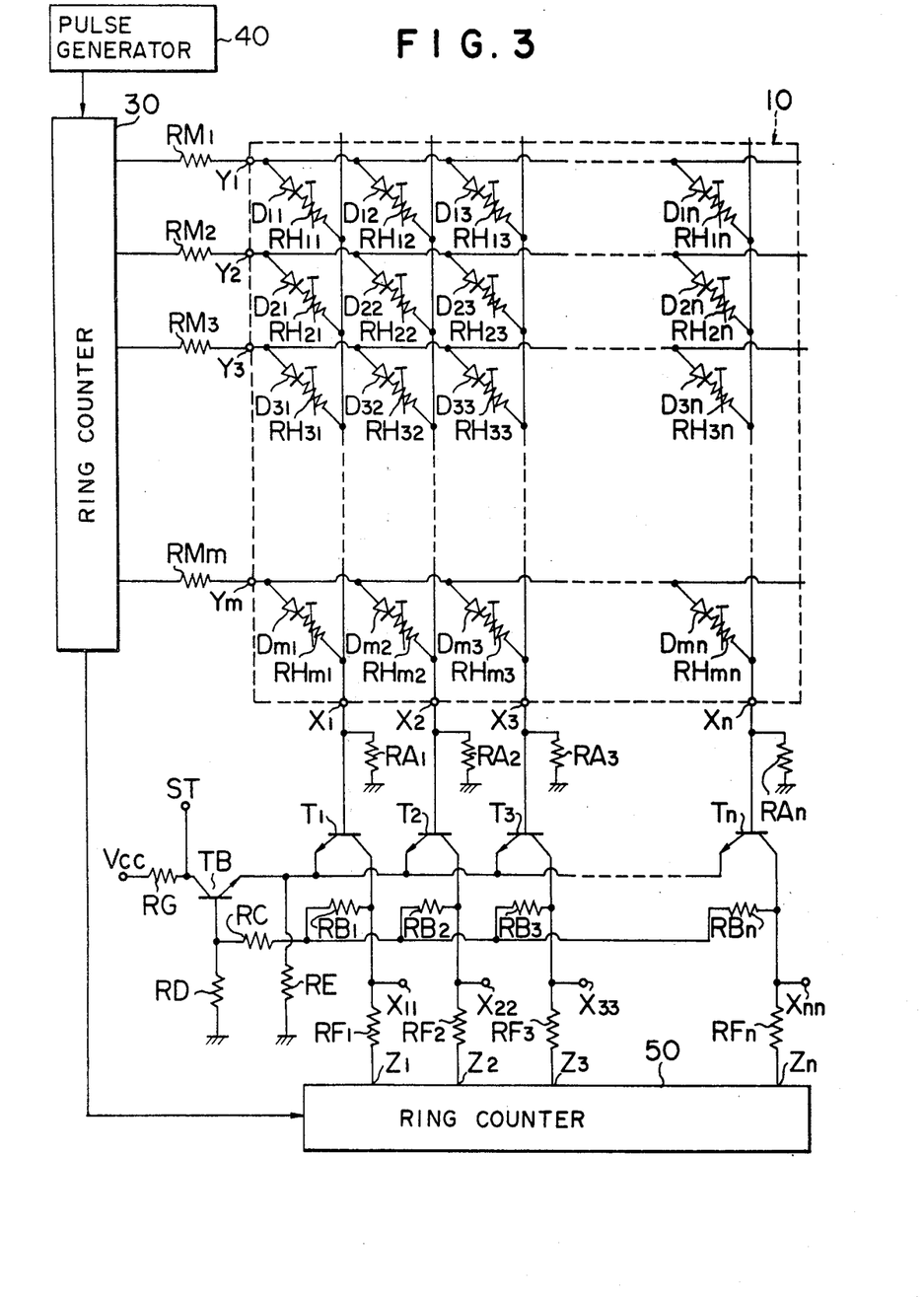
FIG. 3 is a circuit diagram of one embodiment of the switch circuit which employs the switch matrix circuit according to the invention.

FIG. 3 shows one embodiment of the switch circuit which employs the switch matrix circuit 10 shown in FIG. 1. Specifically, the row terminals $Y_1, Y_2 \ldots Y_m$ of the switch matrix circuit 10 are connected with individual output terminals of a ring counter 30 through current limiting resistors $RM_1, RM_2 \ldots RM_m$. The ring counter 30 is connected with a pulse oscillator 40 which generates pulses having a period which is sufficiently small as compared with the duration of a key signal which will be produced when the key switch 20 is depressed, or the time interval during which the reluctance element $RH_{ij}$ presents a reduced resistance. By way of example, the pulses generated by the pulse generator 40 may have a period from 50 μsec to 300 μsec or a clock frequency of 50 kHz to 2 MHz. On the other hand, the column terminals $X_1, X_2 \ldots X_n$ of the switch matrix circuit 10 are connected with the base of a series of first stage transistors $T_1, T_2 \ldots T_n$ which form part of a Schmitt circuit, and are also connected to the ground through respective base resistors $RA_1, RA_2 \ldots RA_n$. It will be noted that these resistors $RA_1, RA_2 \ldots RA_n$ are connected in series with the reluctance elements $RH_{ij}$, and provide a bias voltage to the transistors $T_1, T_2 \ldots T_n$.

Each of the series circuits comprising the reluctance element $RH_{ij}$ and the base resistor $RA_j$ ($j = 1 \sim n$) is connected in shunt with the resistor $RM_i$ ($i = 1 \sim m$) which is connected with the lead terminal $Y_i$ ($i = 1 \sim m$) of each row, and thus compensates for the influence of the temperature dependence of the reluctance elements $RH_{ij}$. This temperature compensation feature is more fully described in the U.S. Pat. No. 3,764,818.

The transistors $T_1, T_2 \ldots T_n$ which form the first stage of the Schmitt circuit have their emitters connected together and with the emitter of a common transistor TB of the second stage of the Schmitt circuit, all these emitters being connected with the ground through a common emitter resistor RE. The collector of the transistors $T_1, T_2 \ldots T_n$ is connected through an individual resistor $RB_1, RB_2 \ldots RB_n$ and through a common resistor RC with the base of the transistor TB, which base is connected with the ground through a base resistor RD. The collectors of the transistors $T_1, T_2 \ldots T_n$ are individually connected with n output terminals $Z_1, Z_2 \ldots Z_n$ of a ring counter 50 through collector resistors $RF_1, RF_2 \ldots RF_n$, and also connected with output terminals $X_{11}, X_{22} \ldots X_{nn}$, respectively. The ring counter 50 is arranged so that it steps once for each pulse applied to the lead terminal $Y_1$ from the ring counter 30. The collector of the transistor TB is connected through a collector load resistor RG with a source $V_{cc}$, and is directly connected with a strobe terminal ST.

Figure 4A:
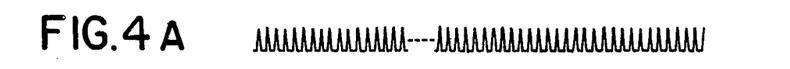
FIGS. 4A-F graphically show a series of waveforms appearing in various parts of the switch circuit shown in FIG. 3.
Figure 4B:
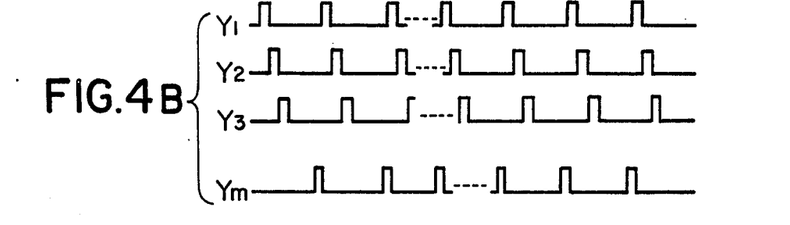
Figure 4C:
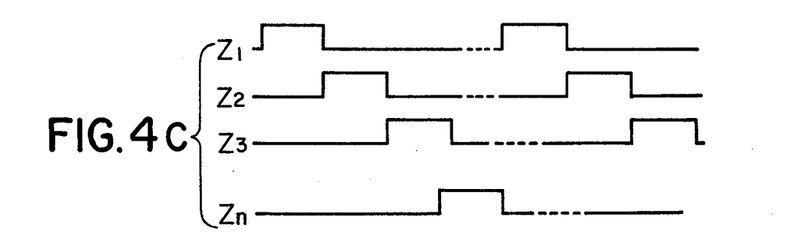

The operation of the circuit shown in FIG. 3 will be described with reference to the waveforms shown in FIG. 4. The pulse generator 40 generates pulses as indicated in FIG. 4A, which pulses cause a shifting operation of the ring counter 30. Thus, the ring counter 30 produces successive pulses at the lead terminals $Y_1, Y_2 \ldots Y_m$ as shown in FIG. 4B. The ring counter 50 produces pulses having a pulse width which corresponds in duration to one cycle of the ring counter 30, as shown in FIG. 4C. Specifically, the initial pulse produced from the output terminal $Z_1$ of the ring counter 50 corresponds to the first series of pulses which are produced at the lead terminals $Y_1$ to $Y_m$, and the second pulse from the ring counter 50 corresponds to the next series of the pulses produced at the lead terminals $Y_1$ to $Y_m$ and so on. The frequency of the pulses produced by the ring counter 50 is chosen so that one cycle of the ring counter 50 or the time required for the full stage of the ring counter 50 to be stepped through is less than the time interval during which the key top is being depressed, thereby permitting pulses to be produced from all of the output terminals $Z_1, Z_2 \ldots Z_n$ within a period during which a key signal is being developed.

Figures 4D, 4E:
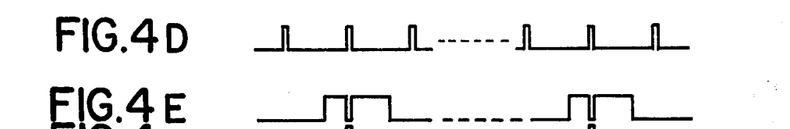
Figure 4F:
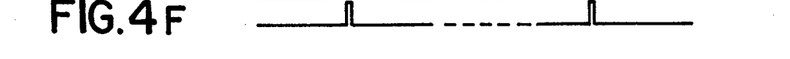

If it is now assumed that a key switch 20 which is connected between the third row (terminal $Y_3$) and the second column (terminal $X_2$) is operated, the reluctance element $RH_{32}$ will present a reduced resistance, whereby the pulse applied to the lead terminal $Y_3$ causes a pulse as shown in FIG. 4D to appear at the lead terminal $X_2$. Since the transistor $T_2$ is driven by a pulse from the output terminal $Z_2$ of the ring counter 50, it is operated upon coincidence of the signal from the lead terminal $X_2$ and the pulse from the output terminal $Z_2$. As a result, a signal will be produced at the output terminal $X_{22}$ connected with the collector of the transistor $T_2$ as shown in FIG. 4E. In other words, a signal is derived at the output terminal $X_{22}$ at a position in time which is determined by the specific combination of row and column of the switch matrix. At this time, a signal as shown in FIG. 4F is obtained at the collector of the transistor TB or the strobe terminal ST.

When another key switch 20 is depressed, a similar signal will be produced at the corresponding output terminal $X_{ii}$ which is determined by the particular combination of the row and column. Thus, the depression of more than one key tops does not result in a simultaneous generation of more than one key signals.

In the circuit of FIG. 3, where the number of reluctance elements $RH_{ij}$ which are connected to one lead terminal $Y_i$ or the resistor $RM_i$ of each row is small, for example, from one to four, the level of the signal appearing at the lead terminal $X_j$ may be greatly influenced by the temperature fluctuation, resulting in a failure to operate the transistor $T_j$. This can be avoided by replacing the common emitter resistor RE by a temperature compensating element having the opposite temperature characteristic to that of the reluctance element, e.g. by a thermistor or Zener diode having a positive temperature characteristic where the reluctance element $RH_{ij}$ used in the arrangement of FIG. 3 has a negative temperature characteristic. Additionally, the fixed resistors $RB_1$, $RB_2$ ... $RB_n$ shown in FIG. 3 may be replaced by diodes.

Figure 5:
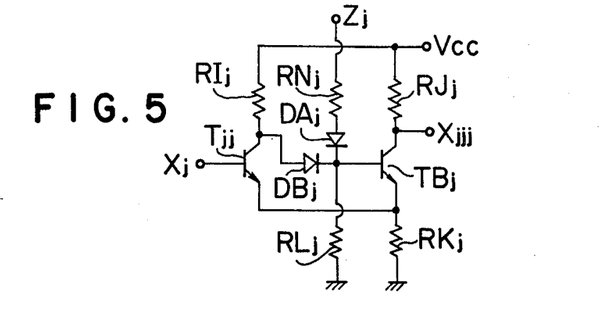
FIG. 5 is a circuit diagram of another example of Schmitt circuit which may be used in the switch matrix circuit according to the invention.

FIG. 5 shows another example of the Schmitt circuit which is connected with the lead terminal $X_j$ of the switch matrix circuit 10. The The lead terminal $X_j$ is connected with the base of a first transistor $T_{jj}$, the emitter of which is connected with the emitter of a second transistor $TB_j$ and connected with the ground through an emitter resistor $RK_j$. The collector of the transistor $T_{jj}$ is connected through a resistor $RI_j$ with a power source $V_{cc}$ and also connected with base of the transistor $TB_j$ through a diode $DB_j$. This base is connected with the ground a resistor $RL_j$, and is also connected with the output terminal $Z_j$ of the ring counter 50 through a series circuit comprising a diode $DA_j$ and a resistor $RN_j$. The collector of the transistor $TB_j$ is connected through a resistor $RJ_j$ with the power source $V_{cc}$ and is also connected with an output terminal $X_{jjj}$.

Signals of waveforms as shown in FIGS. 4B and 4C are applied to the lead terminal $X_j$ and the output terminal $Z_j$, so that a signal indicative of the row and column across which the key switch 20 depressed is connected is produced at the output terminal $X_{jjj}$.

Figure 6:
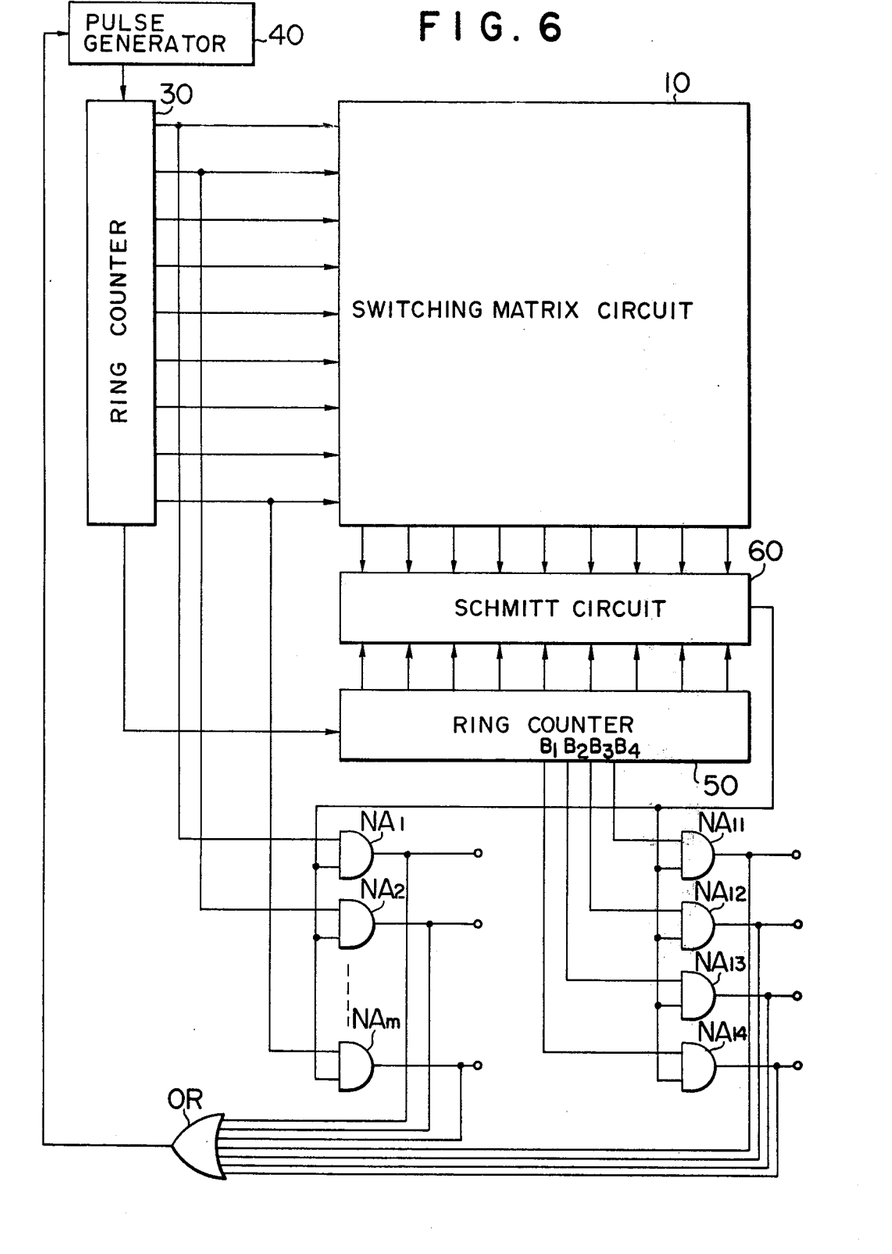
FIG. 6 is a block diagram of another embodiment of the keyboard switch circuit according to the invention.

FIG. 6 is a block diagram of another embodiment of the keyboard switch circuit according to the invention. In this Figure, parts corresponding to those shown in FIG. 3 are designated by like numerals and will not be described again. A Schmitt circuit 60 of the construction as shown in FIG. 3 produces a strobe signal at its terminal ST, which is applied to a plurality of AND gate circuits $NA_1$, $NA_2$ ... $NA_m$ together with signals applied to the lead terminals $Y_1$, $Y_2$ ... $Y_m$ of the switch matrix circuit 10 from the ring counter 30. The output terminals of these AND gate circuits are connected with the respective output terminals of the keyboard switch circuit. In addition, these output terminals are connected to a multiple input OR gate circuit OR, which is in turn connected with the pulse generator 40.

The strobe signal from the terminal ST is also applied to a plurality of AND gate circuits $NA_{11}$, $NA_{12}$, $NA_{13}$ and $NA_{14}$ together with a binary coded signal which is produced on the output terminals $B_1$, $B_2$, $B_3$ and $B_4$ of the ring counter 50. The output terminals of these AND gate circuits provide an encoded output from the keyboard switch circuit.

In operation, when a particular key switch is depressed, an output pulse appears from a particular AND gate circuit, for example, from $NA_2$, and after passing through the OR gate circuit OR, interrupts the operation of the pulse generator 40. As a result, the output signal from the AND gate circuit $NA_2$ continues to exist during the time the key top 23 is being depressed, and because the operation of the pulse generator 40 is interrupted, the code of the output signal obtained on the binary signal terminals $B_1$ to $B_4$ of the ring counter 50 is specified. Consequently, even if key top is struck twice, only the initial key signal will be transmitted from the keyboard switch circuit. Because such operation is controlled by the strobe signal which is directly derived from the Schmitt circuit, a high speed response is achieved without any substantial delay relative to the operation of the key switch.

Figure 7:
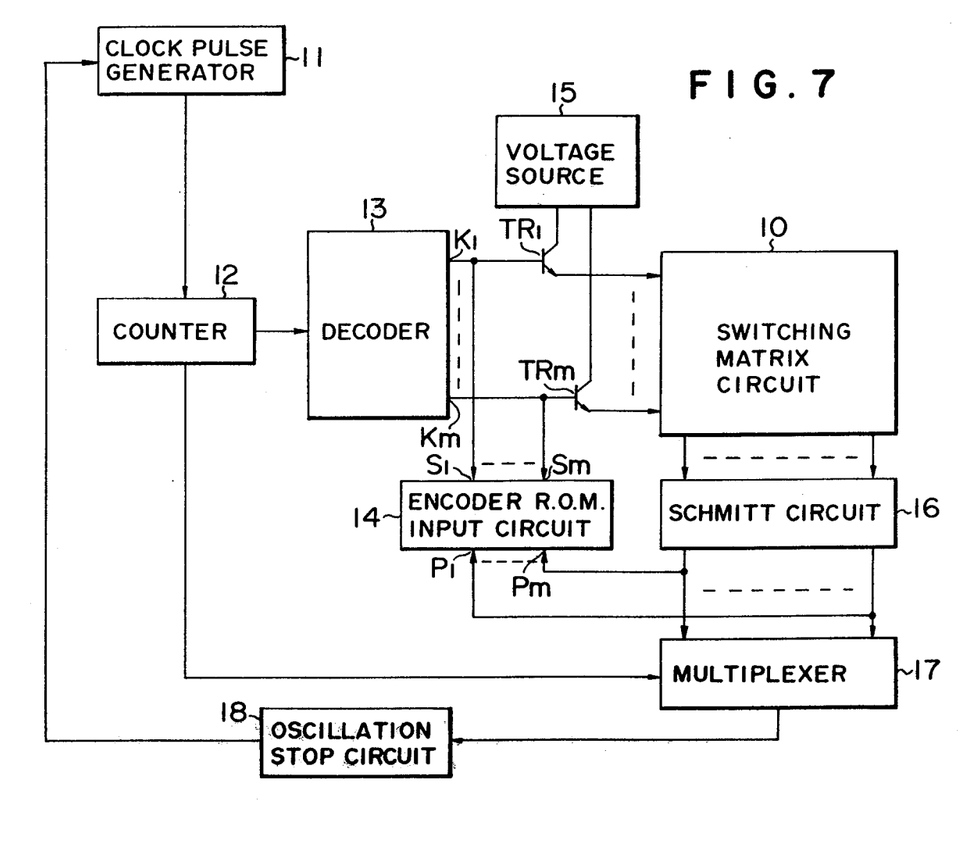
FIG. 7 is a block diagram of the encoder ROM drive circuit according to the invention.

FIG. 7 is a block diagram showing one embodiment of the encoder ROM drive circuit which employs the switch matrix circuit 10 according to the invention. Specifically, a pulse from a clock pulse generator 11 causes an 8 bit counter 12 to step. A four bit MSB (Most Significant Memory) signal from the counter 12 is supplied to a decoder 13 for conversion into a decimal signal. The decoder 13 includes fourteen output terminals $K_1$, $K_2$ ... $K_m$, which are connected with fourteen input terminals $S_1$, $S_2$ ... $S_m$ of the input circuit of the encoder ROM, and are also connected with the respective base of fourteen transistors $TR_1$, $TR_2$ ... $TR_m$. These transistors have their emitters connected with lead terminals $Y_1$, $Y_2$ ... $Y_m$ of the switch matrix circuit 10, respectively, and have their collectors connected to an output terminal of a common constant voltage source 15. To provide temperature compensation of the reluctance elements $RH_{ij}$ located within the switch matrix circuit 10, this voltage source controls the current flow through the elements $RH_{ij}$ in accordance with a variation in the temperature. The lead terminals $X_1$, $X_2$ ... $X_n$ of the switch matrix circuit 10 are connected with a Schmitt circuit 16 which produces each individual output. It should be noted that the Schmitt circuit 16 is provided with the resistors $RA_1$, $RA_2$ ... $RA_n$ shown in FIG. 3. The Schmitt circuit 16 may comprise a conventional high speed response type, in which case the Schmitt circuit is individually connected with the lead terminals $X_1$, $X_2$ ... $X_n$.

The fourteen output terminals of the Schmitt circuit 16 are connected with the other fourteen input terminals $P_1$, $P_2$ ... $P_m$ of the encoder ROM input circuit 16. In response to a pair of input signals applied simultaneously, the input circuit 14 of the encoder ROM specifies a particular key signal which is defined by the particular combination of row and column. The outputs of the Schmitt circuit 16 are applied to a multiplexer 17 which also receive a 4 bit LSB (Least Significant Bit) signal from the counter 12, thus producing a strobe signal in response to an output from the Schmitt circuit 16. The strobe output of the multiplexer 17 operates an oscillation stop circuit 18, which interrupts the operation of the pulse generator 11, thus stopping the counter 12.

In the above circuit arrangement, assuming that the counter 12 has come to a stop with the output terminal $K_3$ of the decoder 13 at a high level, the input terminal $S_3$ of the input circuit 14 of the encoder ROM will also assume a high level, whereby all of the key switches in the row $Y_3$ of the switch matrix circuit 10 are ready to be operated. If a key switch in the column $X_5$ is depressed under this condition, the reluctance element $RH_{35}$ will present a reduced resistance, whereby an output signal appears from the Schmitt circuit 16 in the column $X_5$. The input terminal $P_5$ of the input circuit 14 of the encoder ROM will assume a high level. When the key switch is released, the output of the multiplexer 17 returns to its initial condition, with the falling edge operating the oscillation stop circuit 18 to unlock the counter 12, which therefore again commences to count.

Figure 8:
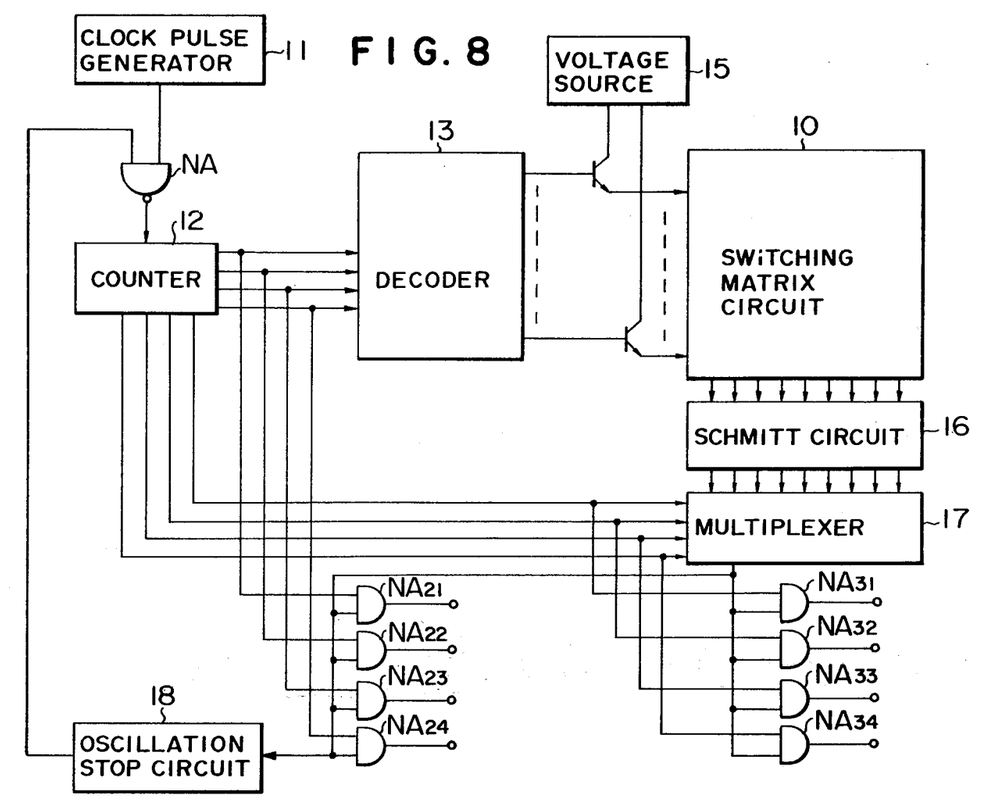
FIG. 8 is a block diagram of a further embodiment of the keyboard switch circuit according to the invention.

FIG. 8 is a block diagram showing a further embodiment of the keyboard switch circuit according to the invention for the ASCII code without using the encoder ROM. Parts corresponding to those showin in FIG. 7 are designated by like numerals or characters and will not be specifically described. The strobe signal from the multiplexer 17 is applied to AND gate circuits $NA_{21}$, $NA_{22}$, $NA_{23}$ and $NA_{24}$ together with four bit signal of MSB side which is supplied from the counter 12 to the decoder 13. The strobe signal is also applied to AND gate circuits $NA_{31}$, $NA_{32}$, $NA_{33}$ and $NA_{34}$ together with four bit signal of LSB side which is supplied from the counter 12 to the multiplexer 17. These AND gate circuits operate to produce a keyboard output indicative of a particular key switch which is encoded in accordance with the ASCII code.

In operation, the strobe signal from the multiplexer 17 is applied through the oscillation stop circuit 18 to a NAND gate circuit NA together with the clock pulse from the clock pulse generator 11, thus inhibiting the clock pulse from being applied to the counter 12. Thus the operation of the counter 12 is interrupted, defining a signal code which is supplied from the counter 12 to the decoder 13, the multiplexer 17 and AND gate circuits $NA_{21}$ to $NA_{24}$, $NA_{31}$ to $NA_{34}$. As a consequence, if a particular key top is struck twice to cause a second key signal other than the first one to appear, the presence of the strobe signal which is produced in response to the first key depression prevents the output of the keyboard switch circuit from being influenced by the second key signal, thus avoiding the roll-over error.

While the invention has been described with reference to particular embodiments shown and described herein, it should be understood that various modifications and changes will readily occur to those skilled in the art without departing from the scope and spirit of the invention which is solely defined by the appended claims.

What is claimed is:

1. A keyboard switch circuit comprising a switch matrix circuit including m rows and n columns where m and n represent positive integers, each of the rows and columns being individually associated with a lead terminal, the switch matrix circuit further including n . m series circuits each comprising a diode and a reluctance element, each of the series circuits being connected across a particular one of the rows and a particular one of the columns so as to correspond to a particular key switch, each key switch including magnetic means for generating a flux density, all of the diodes being poled to conduct forwardly from the rows toward the columns or vice versa, the reluctance elements being constructed such that the flux density applied thereto is varied by actuation of a corresponding key switch to thereby vary the resistance presented by the element; a first circuit means for sequentially applying pulses to the lead terminals which are associated with either rows or columns; and second circuit means responsive to pulses appearing on the columns or rows for producing a pulse output, the second circuit means comprising a Schmitt trigger circuit connected with the lead terminals which are connected to the cathode of the diode in the switch matrix circuit, the Schmitt trigger circuit having a plurality of first stage transistors each having its base connected to one of the lead terminals, and a common second stage transistor connected to the emitters of the first transistors and connected to ground through a common emitter resistance means, whereby when a particular key switch is operated, a corresponding key signal is produced by the second circuit means.

2. A keyboard switch circuit according to claim 1 in which the first circuit means is connected with the lead terminals which are connected with the anode of the diodes in the switch matrix circuit.

3. A keyboard switch circuit according to claim 2 in which the first circuit means comprises a ring counter circuit.

4. A keyboard switch circuit according to claim 2 in which the first circuit means comprises a clock counter circuit, a decode circuit for decoding a bit signal from the counter circuit, and a transistor circuit connected with the output terminal of the decoder circuit.

5. A keyboard switch circuit according to claim 4 in which the transistor circuit comprises a plurality of transistors and a constant voltage source, the transistors having their base individually connected with a plurality of output terminals of the decoder circuit, having their emitter individually connected with the lead terminals and having their collector connected with the voltage source.

6. A keyboard switch circuit according to claim 5 in which the constant voltage source compensates for the temperature dependence of the switch matrix circuit.

7. A keyboard switch circuit according to claim 2, further including a plurality of current limiting resistors which are individually connected between the first circuit means and the lead terminals.

8. A keyboard switch circuit according to claim 1 in which the lead terminals which are connected with the cathode of the diodes in the switch matrix circuit are individually connected with the ground through respective resistors.

9. A keyboard switch circuit according to claim 1 in which the second circuit means comprises a counter circuit which applies a pulse signal corresponding to the respective lead terminals to the Schmidt circuit, the pulse signal having a pulse width of a duration which corresponds to a time interval during which pulses will appear on each of the lead terminals associated with the columns or rows.

10. A keyboard switch circuit according to claim 1, further including a counter which is connected with the collector of the respective first stage transistors through individual resistors.

11. A keyboard switch circuit according to claim 1 in which the collector of the second stage transistor is connected with a strobe signal terminal.

12. A keyboard switch circuit according to claim 4, further including an encoder ROM input circuit for receiving a signal from the decoder circuit and a signal from the second circuit means to define a key signal corresponding to a particular key switch which is determined by a particular combination of row and column, a multiplexer for passing a signal from the second circuit means, and an oscillation stop circuit for interrupting the counting operation of the clock counter circuit in response to an output from the multiplexer.

13. A keyboard switch circuit according to claim 4, further including a multiplexer for passing a signal from the second circuit means, an oscillation stop circuit for interrupting the counting operation of the clock counter circuit in response to an output from the multiplexer, and a plurality of AND gate circuits which receive the output of the multiplexer and a bit signal from the clock counter circuit.

14. A keyboard switch circuit according to claim 1 in which the first circuit means comprises a first ring counter circuit, and a pulse oscillator for supplying a clock pulse to the first ring counter circuit, and further including a plurality of AND gate circuits which receive a first signal from the common second stage transistor of the Schmitt trigger circuit and separate output signals supplied from the first ring counter circuit to the switch matrix circuit, and an OR gate circuit which is connected to the outputs of the plurality of AND gate circuits to interrupt the operation of the pulse oscillator when a key switch is operated.

15. A keyboard switch circuit according to claim 1 wherein the common emitter resistance means is a temperature compensating element having a thermal characteristic which is opposite to that of the reluctance elements.

16. A keyboard switch circuit according to claim 1 wherein the common emitter resistance means is a common emitter resistor.

* * * * *